United States Patent
Chirko et al.

(10) Patent No.: US 10,714,306 B2
(45) Date of Patent: Jul. 14, 2020

(54) MEASURING A HEIGHT PROFILE OF A HOLE FORMED IN NON-CONDUCTIVE REGION

(71) Applicant: APPLIED MATERIALS ISRAEL LTD., Rehovot (IL)

(72) Inventors: Konstantin Chirko, Rehovot (IL); Orit Hava Armon Hershkovich, Modiin-Makabim-Reut (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 16/005,278

(22) Filed: Jun. 11, 2018

(65) Prior Publication Data

US 2019/0378683 A1    Dec. 12, 2019

(51) Int. Cl.
  *H01J 37/26* (2006.01)
  *H01L 21/66* (2006.01)

(52) U.S. Cl.
  CPC .............. *H01J 37/26* (2013.01); *H01L 22/12* (2013.01); *H01J 2237/221* (2013.01); *H01J 2237/2448* (2013.01); *H01J 2237/24495* (2013.01); *H01J 2237/24578* (2013.01); *H01J 2237/24592* (2013.01); *H01J 2237/281* (2013.01)

(58) Field of Classification Search
  None
  See application file for complete search history.

(56) References Cited

U.S. PATENT DOCUMENTS

| | | | | |
|---|---|---|---|---|
| 5,757,502 A * | 5/1998 | Weling | ................... | G01B 11/06 356/630 |
| 2013/0248705 A1* | 9/2013 | Hayashi | ................... | H01J 37/02 250/307 |
| 2013/0292568 A1* | 11/2013 | Bizen | ..................... | G01B 15/00 250/307 |
| 2014/0367586 A1* | 12/2014 | Frosien | ................. | H01J 37/045 250/397 |
| 2016/0379798 A1* | 12/2016 | Shishido | ............... | H01J 37/244 250/307 |

* cited by examiner

*Primary Examiner* — James Choi
(74) *Attorney, Agent, or Firm* — Kilpatrick Townsend & Stockton LLP (57) ABSTRACT

A system, computer program product and a method for measuring a hole. The method may include charging a vicinity of the hole having a nanometric width; obtaining, multiple electron images of the hole; wherein each electron image is formed by sensing electrons of an electron energy that exceeds an electron energy threshold that is associated with the electron image; wherein electron energy thresholds associated with different electron images of the multiple electron images differ from each other; receiving or generating a mapping between height values and the electron energy thresholds; processing the multiple electron images to provide hole measurements; and generating three dimensional measurements of the hole based on the mapping and the hole measurements.

15 Claims, 5 Drawing Sheets

MEASURING A HEIGHT PROFILE OF A HOLE FORMED IN NON-CONDUCTIVE REGION

BACKGROUND OF THE INVENTION

Integrated circuits are manufactured by a highly complex manufacturing process.

The integrated circuits may be evaluated during the manufacturing process and even after a completion of the manufacturing process.

The evaluation of the integrated circuit may include inspecting the integrated circuit, reviewing the integrated circuit, and additionally or alternatively, measuring structural elements of the integrated circuit.

A high aspect ratio hole may have a width that is a fraction (for example—below 25%, below 20%, below 15%, below 10% and the like) of the depth of the hole.

It is hard to image high aspect ratio holes—as top images of the high aspect ratio holes provide only limited information about the hole—such as an inaccurate indication of a cross section of the hole at a single height.

There is a growing need to provide an efficient method for inspecting a high aspect ratio hole.

SUMMARY

There may be provided a method for measuring a hole, the method may include (a) Charging a vicinity of the hole; wherein the hole has a nanometric width. (b) Obtaining, by a charged particle imager, multiple electron images of the hole. Each electron image of the multiple electron images may be formed by sensing electrons of an electron energy that exceeds an electron energy threshold that is associated with the electron image. Electron energy thresholds associated with different electron images (of the multiple electron images) differ from each other. (c) Receiving or generating a mapping between height values and the electron energy thresholds. (d) Processing the multiple electron images to provide hole measurements.

(e) Generating three dimensional measurements of the hole based on the mapping and the hole measurements.

There may be provided a computer program product that stores instructions that once executed by a computerized system cause the computerized system to perform the steps of: (a) Charging a vicinity of the hole; wherein the hole has a nanometric width. (b) Obtaining, by a charged particle imager, multiple electron images of the hole. Each electron image of the multiple electron images may be formed by sensing electrons of an electron energy that exceeds an electron energy threshold that is associated with the electron image. Electron energy thresholds associated with different electron images (of the multiple electron images) differ from each other. (c) Receiving or generating a mapping between height values and the electron energy thresholds. (d) Processing the multiple electron images to provide hole measurements. (e) Generating three dimensional measurements of the hole based on the mapping and the hole measurements.

There may be provided a system for measuring a hole, the system may include a charged particle imagers that is configured to charge a vicinity of the hole; wherein the hole has a nanometric width; obtain multiple electron images of the hole; wherein each electron image of the multiple electron images is formed by sensing electrons of an electron energy that exceeds an electron energy threshold associated with the electron image; wherein electron energy thresholds associated with different electron images of the multiple electron images differ from each other; a processor that is configured to receive or generate a mapping between height values and the electron energy thresholds; process the multiple electron images to provide hole measurements; and generate three dimensional measurements of the hole based on the mapping and the holes. measurements.

BRIEF DESCRIPTION OF THE DRAWINGS

The subject matter regarded as the invention is particularly pointed out and distinctly claimed in the concluding portion of the specification. The invention, however, both as to organization and method of step, together with substrates, features, and advantages thereof, may best be understood by reference to the following detailed description when read with the accompanying drawings in which:

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Any reference in the specification to a method should be applied mutatis mutandis to a system capable of executing the method and to a computer program product that stores instructions for executing the method.

Any reference in the specification to a system should be applied mutatis mutandis to a method that may be executed by the system and to a computer program product that stores instructions for executing the method.

Any reference in the specification to a computer program product should be applied mutatis mutandis to a method that is performed when executing instructions stored in the computer program product and to a system that is arranged and construed to execute the instructions stored in the computer program product.

The computer program product is non-transitory and may include a non-transitory medium for storing instructions. Non-limiting examples of a computer program product are a memory chip, an integrated circuit, a disk, a magnetic memory unit, and a memristor memory unit.

The assignment of the same reference numbers to various components may indicate that these components are similar to each other.

There may be provided a method for measuring a hole. The method may include:

a. Charging (at least) a vicinity of the hole in order to produce electric field directed along the hole dimension to be measured. The hole has a nanometric width.

b. Obtaining, by a charged particle imager, multiple electron images of the hole. Each electron image of the multiple electron images is formed by sensing electrons of an electron energy that exceeds an electron energy threshold associated with the electron image. Electron energy thresholds associated with different electron images of the multiple electron images differ from each other.

c. Receiving or generating a mapping between height values and the electron energy thresholds.
d. Processing the multiple electron images to provide hole measurements.
e. Generating three dimensional measurements of the hole based on the mapping and the hole measurements.

The obtaining of each electron image of the multiple images may include setting an energy filter that precedes a sensor to a reject electrons having an electron energy below an electron energy threshold that is associated with the electron image. The energy filter may be reconfigured to be associated with different electron energy thresholds very quickly, thus increasing the throughput of the system.

Re-setting the energy filter to generate electron images of different electron energy thresholds is much faster, more accurate, and less complicated than changing the energy of the electrons that impinge on the object.

The following examples refer to an object. The object may be a semiconductor wafer, or any other object that has high aspect-ratio holes of nanometric width.

Figure 1:
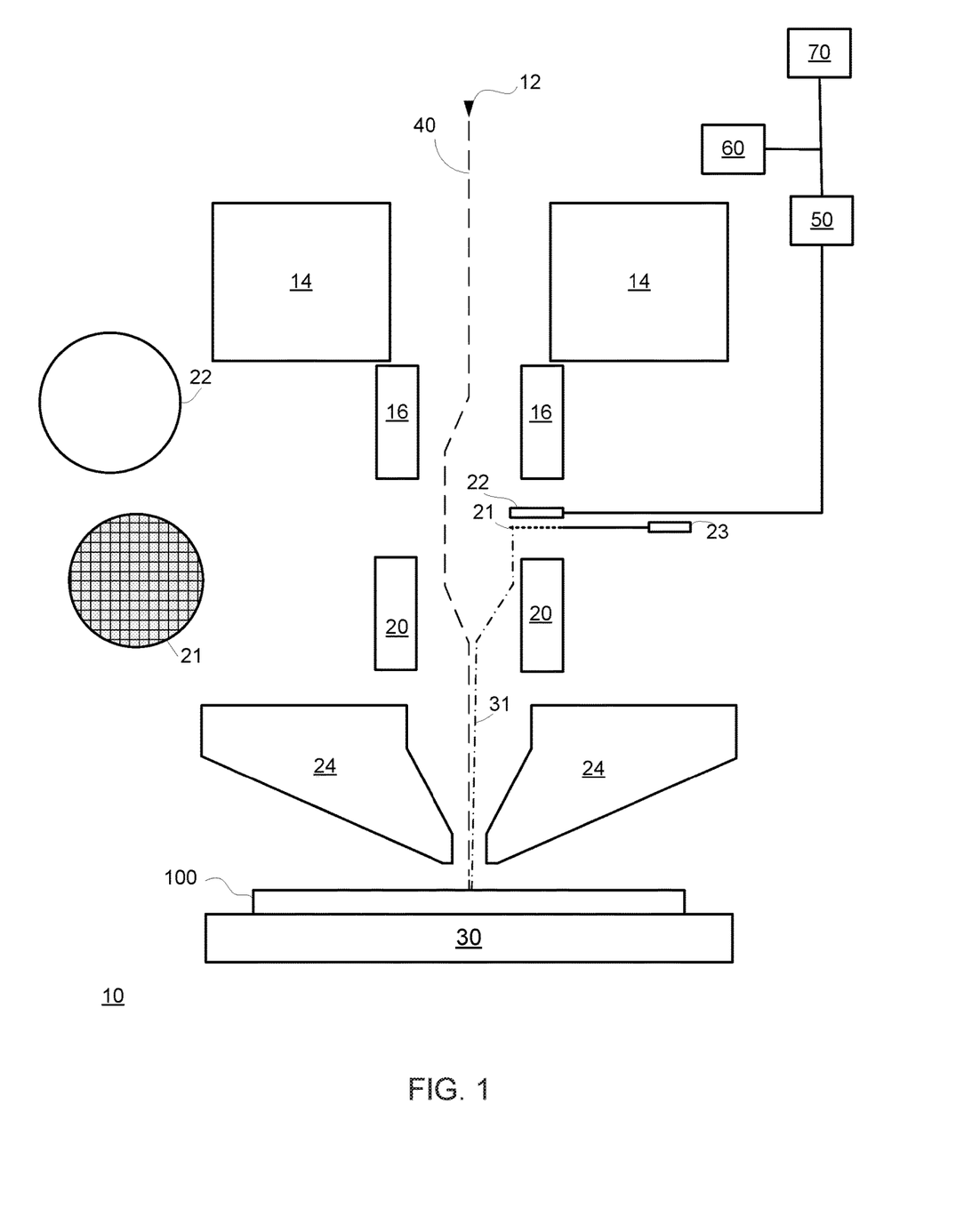
FIG. 1 is an example of an object and a charged particle imager.

FIG. 1 illustrate object 100 and charged particle imager 10. Charged particle imager 10 includes stage 30, processor 50, memory unit 60, controller 70, and electron optics. The electron optics includes beam source 12, condenser lens 14, first deflector 16, second deflector 20, secondary electron detector 22, objective lens 24, energy filter 21 and energy filter supply unit 23.

Stage 30 is arranged to support object 100 and move object.

Controller 70 may control the operation of the charged particle imager 10.

Processor 50 may generate images from detection signals sent from secondary electron detector 22. Processor 50 may be arranged and constructed (for example by being programmed) to execute any step of any method illustrated in the specification.

The phrase "configured to" and the phrase "arranged and constructed" are used in an interchangeable manner.

It should be noted that processor 50 may be located in a remote computer or any other computerized system that differs from the charged particle imager 10.

Beam source 12 generates a primary electron beam 40. FIG. 1 illustrates the primary electron beam 40 as being twice deflected by first deflector 16 and second deflector 20, as passing through objective lens 24, and as impinging on object 100.

The primary electron beam 40 may pass any other path. For example—the primary electron beam 40 may be deflected once or more than twice.

Energy filter 21 precedes the secondary electron detector 22 and is fed by energy filter supply unit 23. The bias voltage that is fed to energy filter 21 determines an electron energy threshold of an image acquired by the secondary electron detector 22.

Multiple images of a hole may be acquired while the energy filter 21 is fed by different bias voltages—to determine multiple electron energy thresholds—thereby acquiring, by secondary electron detector 22, multiple electron images. Each electron image is associated with a unique electron energy threshold—and includes electrons having electron energies that are not lower than the unique electron energy threshold. Different electron images may be taken from different heights.

Secondary electron beam 31 is deflected by second deflector 20 towards secondary electron detector 22.

Secondary electrons of secondary electron beam 31 may pass through energy filter 21 or may be blocked by energy filter 21—depending on the relationship between (a) the energy of the secondary electrons, and (b) the electron energy threshold set by the energy filter 21.

FIG. 1 illustrates secondary electron detector 22 as being an in-lens detector. An in-lens detector is a detector that is located inside a column of a charged particle imager. This is merely an example. The secondary electron detector 22 may be an out-of-lens detector that is located outside a column of a charged particle imager.

It should be noted that the electron optics of charged particle imager 10 may differ from the electron optics of FIG. 1. For example—the secondary electron detector may be any out-of-lens secondary electron detector, the secondary electron detector may be any in-lens secondary electron detector, there may be any number of deflectors, the primary electron beam (when impinging on the object) may be normal to the object or not normal to the object, and the like. The secondary electron detector may be replaced by a detector that detects electrons that are not secondary electrons—for example backscattered electrons.

Figure 2:
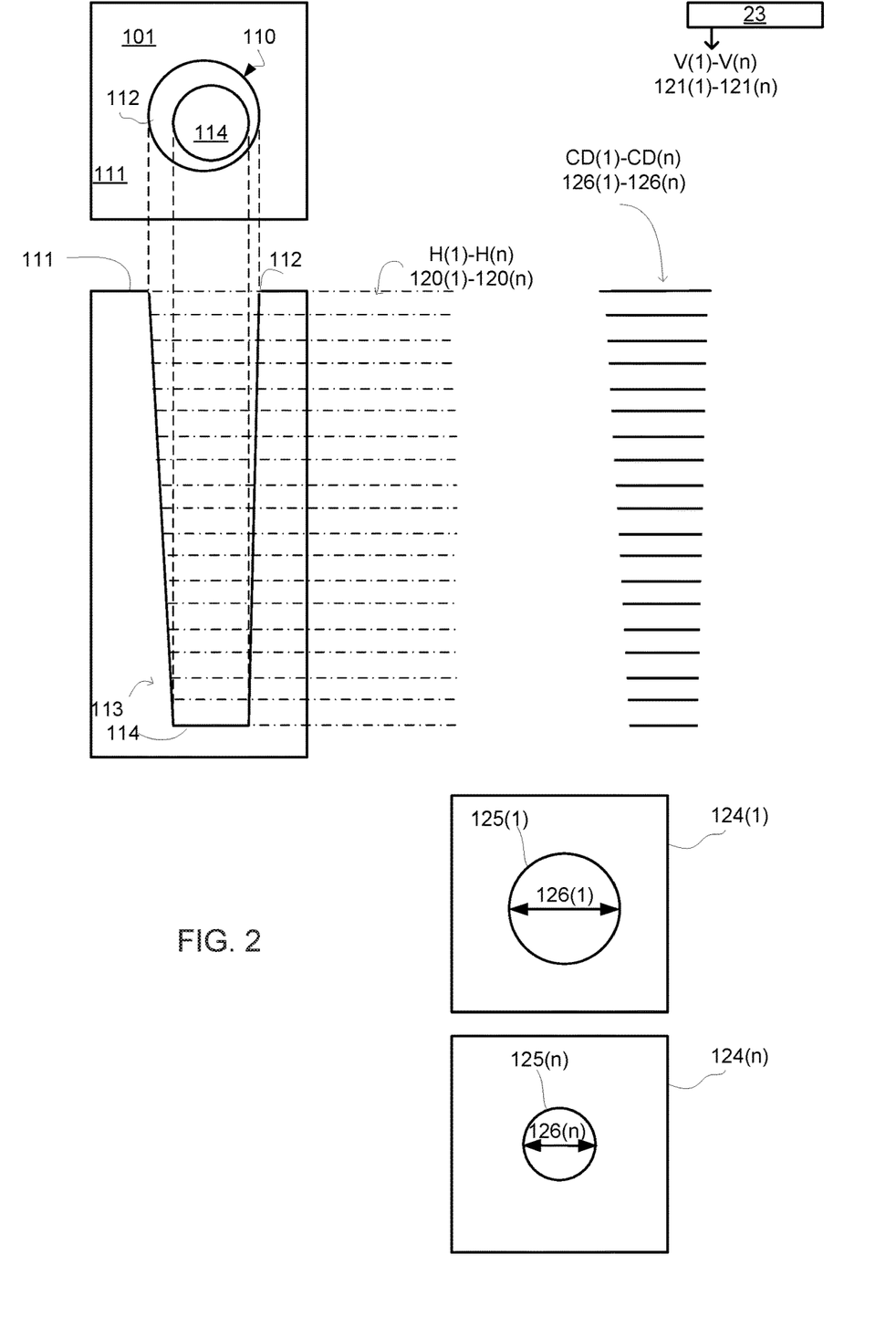
FIG. 2 is an example of an object and a charged particle imager.
Figure 3:
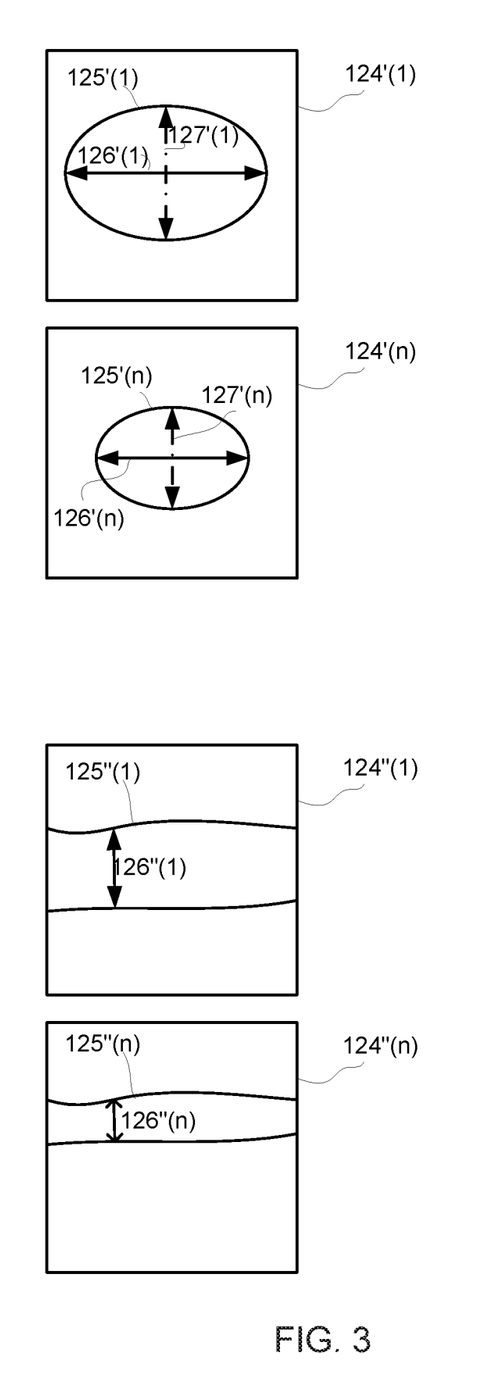
FIG. 3 is an example of an area and various images.

FIG. 2 illustrates a conical hole and includes:
a. A top view of the vicinity of the hole and a cross sectional view of an vicinity 101 of hole 110. The vicinity includes upper surface 111 and the hole 110 The hole 110 includes bottom 114, sloped sidewalls 113, and an upper surface 112. FIG. 3 also illustrates multiple (n) heights H(1)-H(n) 120(1)-120(n) that are illuminated when the energy filter supply unit 23 supplies to the energy filter 21 multiple bias voltages (one bias voltage at a time) V(1)-V(n) 121(1)-121(n)
b. Electron image 124(1) of the vicinity of the hole that includes a first edge 125(1) of the hole. A diameter 126(1) of the hole is measured. Electron image 124(1) is measured when bias voltage V(1) 121(1) is supplied to energy filter 121.
c. Electron image 124(n) of the vicinity of the hole that includes a first edge 125(n) of the hole. A diameter 126(n) of the hole is measured. Electron image 124(n) is measured when bias voltage V(n) 121(n) is supplied to energy filter 121.

FIG. 3 illustrates electron images of an elliptical hole and of a part of a trench.

FIG. 3 includes:
a. Electron image 124'(1) of the vicinity of the hole that includes a first edge 125'(1) of the hole. The hole is elliptical. Two axes 126'(1) and 127'(1) of the ellipse are measured. Electron image 124'(1) is measured when bias voltage V(1) 121(1) is supplied to energy filter 21.
b. Electron image 124'(n) of the vicinity of the hole that includes a first edge 125' (n) of the hole. The hole is elliptical. Two axes 126'(1) and 127'(1) of the ellipse are measured. Electron image 124'(n) is measured when bias voltage V(n) 121(n) is supplied to energy filter 21.
c. Electron image 124"(1) of the vicinity of the hole that includes a first edge 125"(1) of the hole. The hole is a trench. A width 126"(1) of the trench is measured. Electron image 124"(1) is measured when bias voltage V(1) 121(1) is supplied to energy filter 21.
d. Electron image 124"(n) of the vicinity of the hole that includes a first edge 125"(n) of the hole. The hole is a trench. A width 126"(1) of the trench is measured.

Electron image 124"(n) is measured when bias voltage V(n) 121(*n*) is supplied to energy filter 21.

Figure 4:
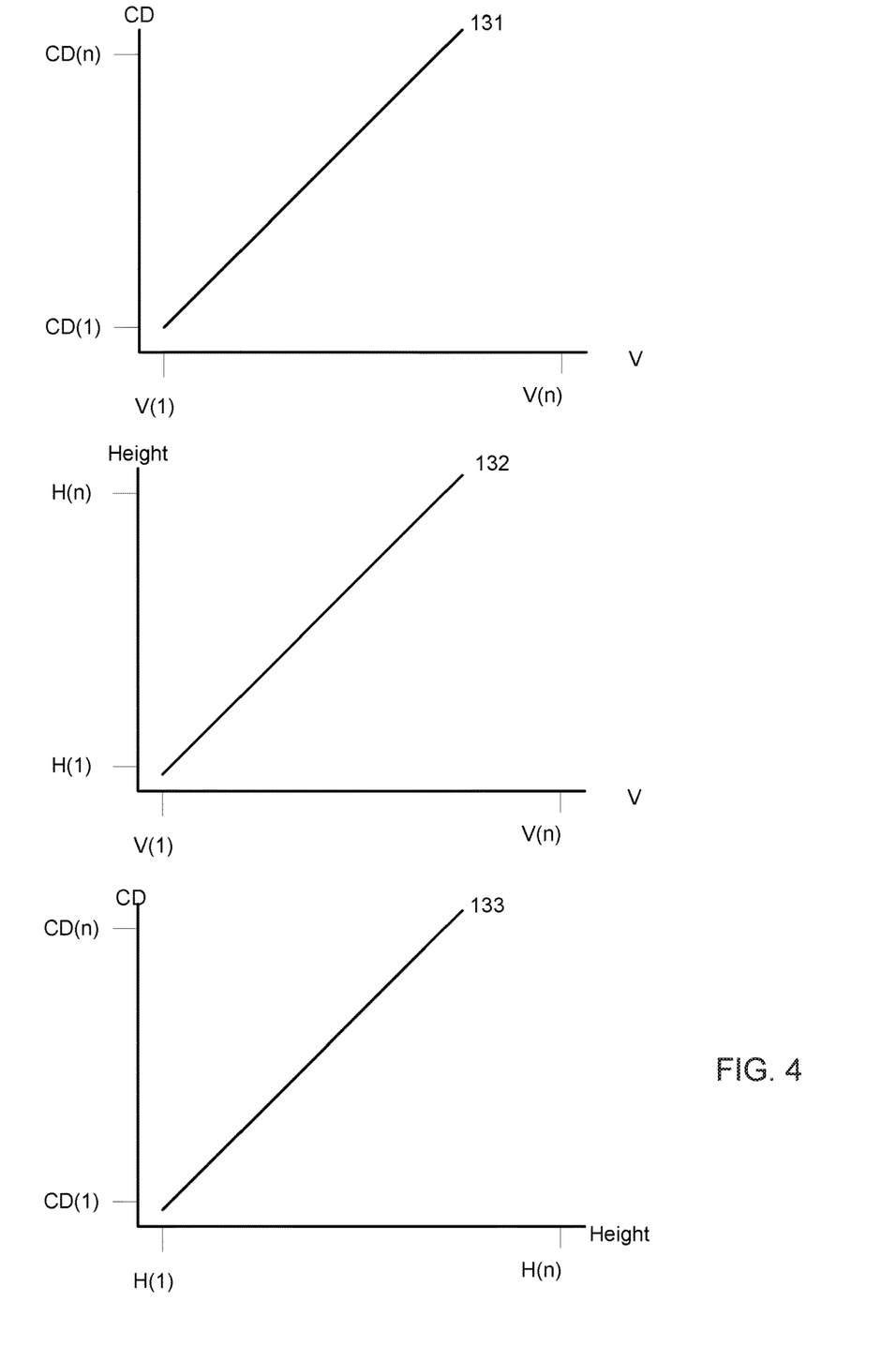
FIG. 4 is an example of an area and various images.

FIG. 4 illustrates examples of:
a. A relationship (131) between critical dimensions CD(1)-CD(n) and bias voltages V(1)-V(n) of a certain hole.
b. A relationship (132) between heights H(1)-H(n) and bias voltages V(1)-V(n). This relationship is an example of the mapping between height values and the electron energy thresholds.
c. A relationship (133) between critical dimensions CD(1)-CD(n) and heights H(1)-H(n) of the certain hole.

Any other relationships may be obtained and calculated.

Figure 5:
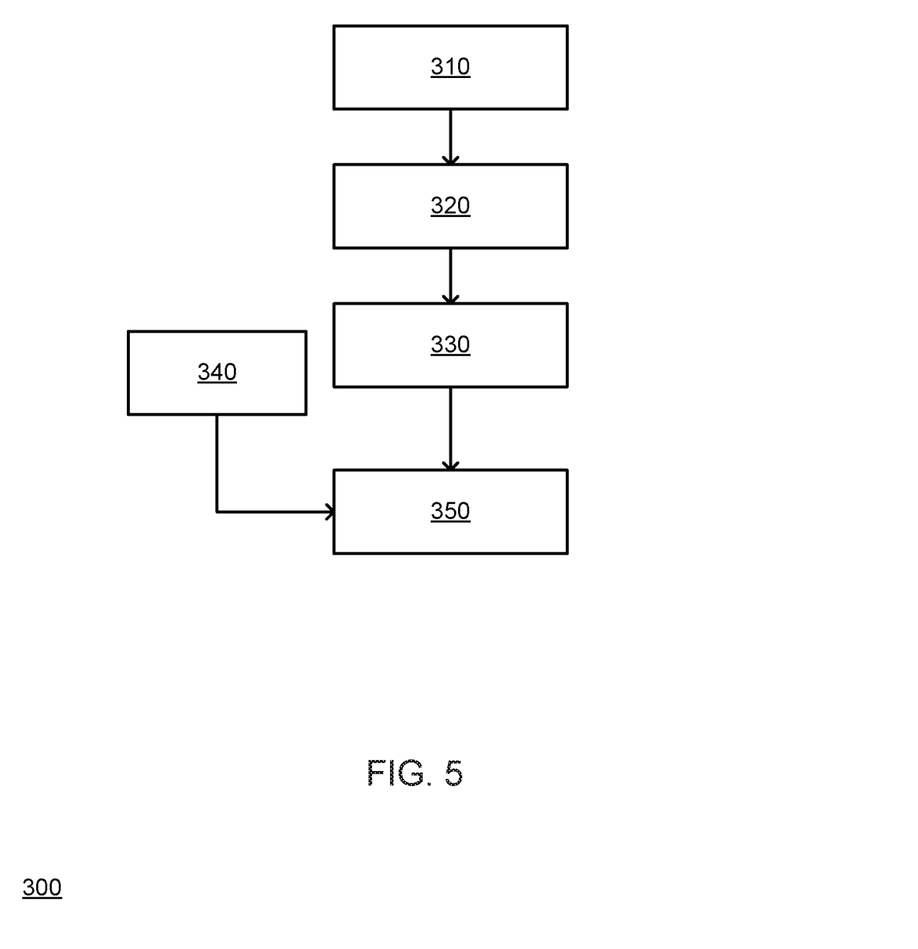
FIG. 5 is an example of a method.

FIG. 5 illustrates an example of method 300.

Method 300 may include a sequence of steps 310, 320, 330 and 340.

Step 310 may include charging a vicinity of the hole. The hole has a nanometric width. The hole may have any aspect ratio. For example the hole may have a high aspect ratio— that may exceed ten.

The vicinity of the hole may span over an area that may be of the same size as the top of the hole, or span over a larger area.

The charging may include illuminating the hole and its vicinity with a defocused charged particle beam—or using a larger beam that the beam used to illuminate the hole during further steps of method 300. Any other charging method may be applied.

Step 310 may include positive charging of a surface of object by scanning of relatively large (about 100 microns) field of view (FOV) immersed in strong extraction field (about 5 kV/mm) with electron beam having energy (about 1 keV) providing SE yield larger than one. Under this irradiation, the positive potential rises until steady state value, which is proportional to the product of FOV width and extracting field strength, is reached. If a positive electrostatic potential is produced at the top of a hole feature and its bottom has a different potential (e.g. is grounded), a uniform or quasi—uniform electrostatic field may be produced along z-axis. Existence of such a field may create a distribution of electrostatic potential V on height along SE emitting surface, which value is proportional to z-coordinate. Due to such functional dependence of potential on height V(z), energy of SE reaching detector have similar dependence on the point of their origin.

Step 320 may include obtaining, by a charged particle imager, multiple electron images of the hole.

Each electron image of the multiple electron images is formed by sensing electrons of an electron energy that exceeds an electron energy threshold associated with the electron image.

Electron energy thresholds associated with different electron images of the multiple electron images differ from each other.

Lower electron energy thresholds may be associated with images of higher heights—from which secondary electrons of lower energy are emitted.

Step 320 may include setting, for each electron image, an energy filter that precedes a sensor to reject electrons having an electron energy below an electron energy threshold that is associated with the electron image.

Step 330 may include processing the multiple electron images to provide hole measurements.

The processing may include finding one or more edges of the hole in each electron image and measuring one or more dimensions of the one or more edges.

When the hole has a conical shape (or another shape without negative sloped parts that do not face the top of the hole) then the electrons of the lower energy are indicative of the edge of the image.

The critical dimension of a circular hole may be the radius or the diameter of circular hole. Critical dimensions of an elliptical hole may be the axes of the elliptical hole.

When the hole is a trench then the critical dimension may be a width of the trench, edge variations, and the like. The edge of the hole may be rigid and step 330 may include approximating the edge to a smoother shape and then measuring the smoother shape.

Step 330 may include performing any known metrology process to evaluate one or more dimensions of the hole.

Method 300 may also include step 340 of receiving or generating a mapping between height values and the electron energy thresholds. The mapping maps electron energy thresholds to heights. The mapping may be determined based on simulations, estimations, based on a calibration process in which reference holes of known shapes are measured.

A calibration process may include acquiring electron images of reference holes using different electron energy thresholds and the comparing the images to the known shapes. A shape of a hole may be known in advance to the calibration process or evaluated after the calibration process—for example by cross sectioning a hole and measuring its cross sections at different heights and matching the measurements to the images.

Steps 330 and 340 may be followed by step 350 of generating three dimensional measurements of the hole based on the mapping and the hole measurements.

The three dimensional measurements may include dimensions of the cross section of the hole at different heights.

Step 350 may include using the mapping to convert the association between electron energy thresholds and the measurements of step 330 to an association between heights and the measurements of step 330.

The three dimensional measurements may provide a three dimensional profile of the hole or at least a partial three dimensional profile of the hole.

It should be noted that method 300 may be applied on multiple holes—and that step 310 may include charging a region that includes multiple holes and that steps 320, 330 and 350 may be executed (in parallel, in a serial manner, and the like) on the multiple holes.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of step in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described steps are merely illustrative. The multiple may be combined into a single step, a single step may be distributed in additional steps and steps may be executed at least partially overlapping in time. Moreover, alternative embodiments may include multiple instances of a particular step, and the order of steps may be altered in various other embodiments.

Also, for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for measuring a hole having a nanometric width formed in an object with a particle imager that includes a secondary electron detector and an energy filter disposed between the object and the secondary electron detector, the method comprising:
    charging a portion of the object in a vicinity of the hole with a charged particle beam;
    obtaining, by a charged particle imager, a plurality of electron images of the hole, wherein each electron image in the plurality of electron images is formed by:
        (i) setting an energy threshold level for the energy filter to block electrons having an electron energy level below the energy threshold from reaching the secondary detector; and
        (ii) sensing, with the secondary detector, electrons of an electron energy that exceeds the electron energy threshold associated with the electron image;
        wherein the energy threshold level for the energy filter is changed for each electron image such that the electron energy threshold is different for each electron image in the plurality of electron images;
    receiving or generating a mapping between height values and the electron energy thresholds;
    processing the multiple electron images to provide hole measurements; and
    generating three dimensional measurements of the hole based on the mapping and the hole measurements.

2. The method according to claim 1, wherein an obtaining of each electron image of the multiple images comprises setting an energy filter that precedes a sensor to a reject electrons having an electron energy below an electron energy threshold that is associated with the electron image.

3. The method according to claim 1, wherein an obtaining of each electron image of the multiple electron images comprises setting a minimal electron energy of electrons of a beam that illuminates the hole.

4. The method according to claim 1, wherein the multiple electron images are multiple secondary electron images.

5. The method according to claim 1, wherein the receiving or generating of the mapping comprises calculating the mapping without receiving the mapping.

6. The method according to claim 1, wherein the receiving or generating of the mapping comprises receiving the mapping without calculating the mapping.

7. The method according to claim 1, wherein the three dimensional measurements comprise information about critical dimensions of the hole at different heights.

8. The method according to claim 1, wherein the charging of the vicinity of the hole imposes a linear relationship between heights within the hole and electrostatic potentials.

9. The method according to claim 1 wherein the multiple electron images of the hole are acquired at a same illumination angle.

10. The method according to claim 1, comprising:
charging vicinities of additional holes; wherein each additional hole has a nanometric width;
obtaining, by the charged particle imager, and for each additional hole, multiple electron images of the additional hole; wherein each electron image of the multiple electron images of the additional hole is formed by sensing electrons of an electron energy that exceeds an electron energy threshold that is associated with the electron image of the additional hole; wherein electron energy thresholds associated with different electron images of the multiple electron images of the additional hole differ from each other;
receiving or generating the mapping between height values and the electron energy thresholds;
processing, for each additional hole, the multiple electron images of the additional hole to provide additional hole measurements; and
generating, for each additional hole, three dimensional measurements of the additional hole based on the mapping and the additional hole measurements.

11. The method according to claim 1, wherein the hole is an elongated trench.

12. The method according to claim 1, wherein the hole has a conical shape.

13. A computer program product that stores instructions that, once executed by a computerized system to measure a hole having a nanometric width formed in an object, causes a particle imager that includes a secondary electron detector and an energy filter disposed between the object and the secondary electron detector to perform the steps of:
charging a portion of the object in a vicinity of the hole with a charged particle beam;
obtaining a plurality of electron images of the hole with the charged particle imager, wherein each electron image in the plurality of electron images is obtained by:
(i) setting an electron energy threshold of the energy filter to block electrons having an electron energy below the energy threshold level from reaching the secondary detector; and
(ii) sensing, with the secondary detector, electrons having an electron energy that exceeds the electron energy threshold associated with the electron image;
wherein the setting for the energy threshold level is changed for each electron image such that the electron energy threshold is different for each electron image in the plurality of electron images;
receiving or generating a mapping between height values and the electron energy thresholds;
processing the multiple electron images to provide hole measurements; and
generating three dimensional measurements of the hole based on the mapping and the hole measurements.

14. A particle imager for measuring a hole having a nanometric width formed in an object, the particle imager comprising:
a stage to support the object;
a secondary electron detector;
an energy filter disposed between the object and the secondary electron detector;
a processor and a memory that stores instructions that, once executed by the processor, cause the particle imager to:
charge a portion of the object in a vicinity of the hole with a charged particle beam;
obtain a plurality of electron images of the hole with the charged particle imager, wherein each electron image in the plurality of electron images is obtained by:
(i) setting an electron energy threshold of the energy filter to block electrons having an electron energy below the energy threshold level from reaching the secondary detector; and
(ii) sensing, with the secondary detector, electrons having an electron energy that exceeds the electron energy threshold associated with the electron image;
wherein the setting for the energy threshold level is changed for each electron image such that the electron energy threshold is different for each electron image in the plurality of electron images;
receive or generate a mapping between height values and the electron energy thresholds;
process the multiple electron images to provide hole measurements; and
generate three dimensional measurements of the hole based on the mapping and the hole measurements.

15. A method for measuring a hole having a nanometric width formed in an object with a charged particle imager that includes a secondary electron detector and an energy filter disposed between the object and the secondary electron detector, wherein an electron energy threshold of images acquired by the secondary electron detector is determined by a bias voltage supplied to the energy filter and wherein the method for measuring the hole comprises:
(a) charging a portion of the object in a vicinity of the hole with a charged particle beam;
(b) obtaining, by the charged particle imager, a plurality of electron images of the hole, wherein the plurality of electron images is formed by:
(i) obtaining an initial electron image of the hole by supplying an initial bias voltage to the energy filter to set an initial electron energy level threshold for the energy filter to block electrons having an electron energy level below the initial electron energy threshold from reaching the secondary detector, and sensing, with the secondary detector, electrons of an electron energy that exceeds the initial electron energy threshold associated with the electron image;
(ii) obtaining a subsequent electron image of the hole by changing the bias voltage supplied to the energy filter to change the electron energy level threshold for the energy filter to a new electron energy threshold level to block electrons having an electron energy level below the new electron energy level threshold, and sensing, with the secondary detector, electrons of an electron energy that exceed the new electron energy threshold associated with the subsequent electron image; and
(iii) repeating step (ii) a plurality of times until the plurality of electron images is obtained, wherein the bias voltage supplied to the energy filter is different for each electron image in the plurality of electron images;
(c) receiving or generating a mapping between height values and the electron energy thresholds;
(d) processing the multiple electron images to provide hole measurements; and
(e) generating three dimensional measurements of the hole based on the mapping and the hole measurements.

* * * * *